United States Patent [19]

Westberg, II

[11] 4,108,217

[45] Aug. 22, 1978

[54] METHOD AND APPARATUS FOR FORMING AND TRIMMING LEADS

[75] Inventor: John Kellogg Westberg, II, Boulder, Colo.

[73] Assignee: Formistor Corporation, Vail, Colo.

[21] Appl. No.: 805,762

[22] Filed: Jun. 13, 1977

[51] Int. Cl.² ............................................. B21F 45/00
[52] U.S. Cl. .............................. 140/105; 72/DIG. 10
[58] Field of Search .................. 140/1, 105, 140, 147; 72/DIG. 10

[56] References Cited

U.S. PATENT DOCUMENTS 3,945,408  3/1976  Halligan ............................. 140/105
4,020,880  5/1977  Heller et al. ........................ 140/105

Primary Examiner—Lowell A. Larson
Attorney, Agent, or Firm—O'Rourke & Harris

[57] ABSTRACT

Apparatus and method for the automatic transport, alignment, and positive orientation of electronic components such as transistors, and the subsequent straightening, trimming to length, and forming of the component wire leads. Components are transported linearly into position and positively located for the lead straightening, trimming and forming operations, these functions being carried out in a single motion at a single station thereby facilitating relatively high processing rates.

15 Claims, 9 Drawing Figures

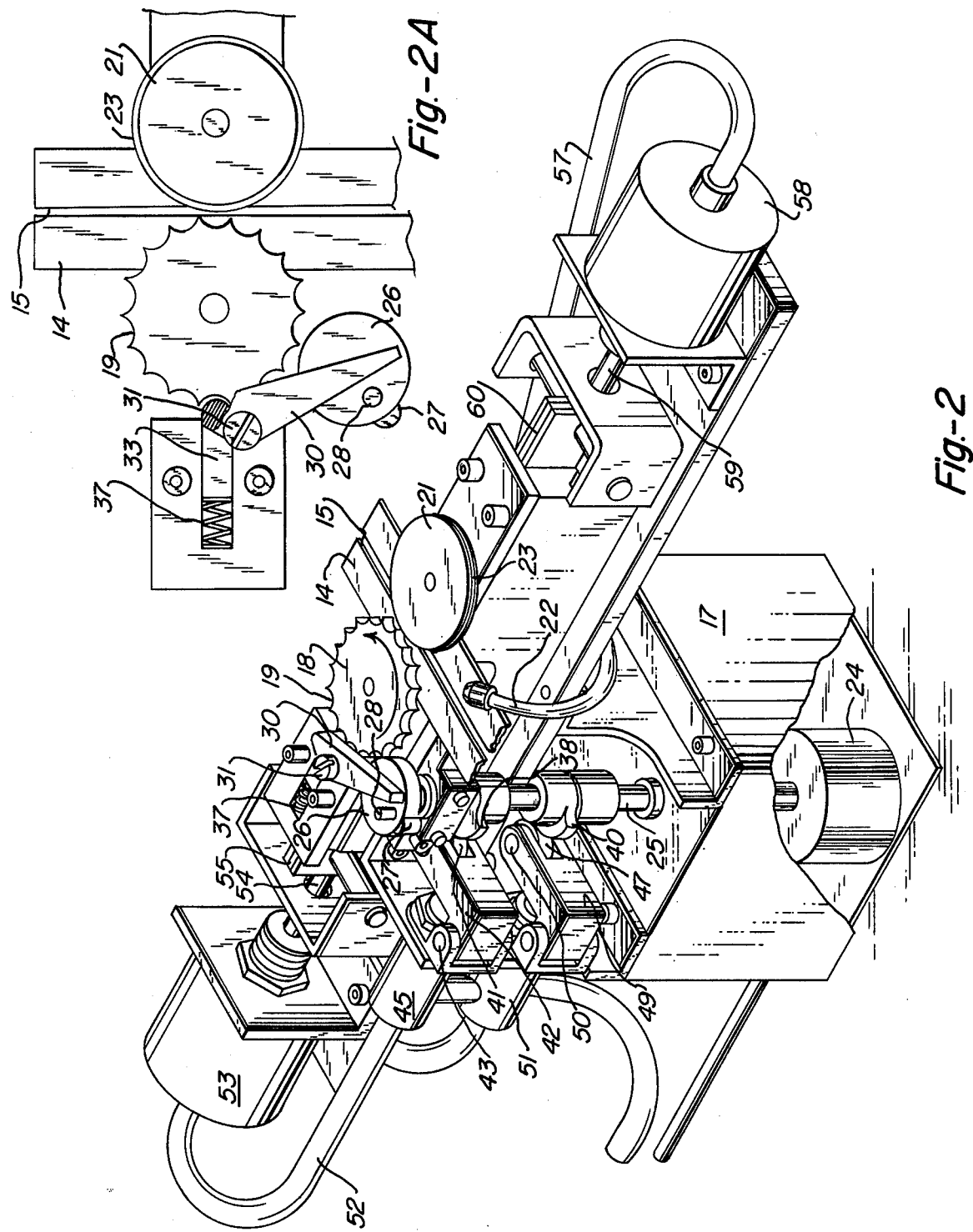

METHOD AND APPARATUS FOR FORMING AND TRIMMING LEADS

BACKGROUND OF THE INVENTION

1. Field of the Invention

The present invention relates to apparatus and methods for trimming and forming wire leads of transistors and similar electronic components as preparation for installing the components on printed circuit boards. Pre-forming component leads is recognized as a useful technique in helping to assure proper positioning of components and to eliminate lead trimming after installation. The present invention relates specifically to apparatus for automatically transporting, aligning, and positioning electronic components and trimming and forming associated leads.

2. Description of Prior Art

The need for equipment to trim and pre-form the leads of electronic components such as transistors was realized early in the development of solid state electronics. Numerous machines have been constructed to perform the necessary functions semi-automatically; that is, to trim and form wire leads of components inserted manually into an aperture. Generally, apparatus of this type use dies to apply force to the wire leads and shape them in the required manner. Die movement is often controlled by an operator-actuated switch. Although the semi-automatic lead forming machines serve to make necessary modifications to components leads for easy installation of components on printed circuit boards, such devices are limited as to production rate because each component must be manually fed into position and subsequently removed after the forming operation.

Means for synchronization and linking of a lead forming apparatus to a feeding mechanism for the purpose of eliminating the rate restrictions imposed by manual feeding are disclosed in U.S. Pat. No. 3,548,998, and further disclosed in modified form with regard to the mechanism in U.S. Pat. No. 3,640,113. The apparatus described includes a transporting wheel to carry components to a plurality of stations where reciprocating dies trim and form leads with limited functions being accomplished at each station. Another example of a multistation processing device is to be found in U.S. Pat. No. 3,396,758.

Devices employing circular routing of components to various processing stations serve the intended purpose well, but as with most mechanical handling apparatus, extending of the route of travel generally decreases speed of operation and increases malfunctions due to mishandling. Also, moving a single die towards a fixed stop involves greater accelerations for a given rate and may complicate the forming step. The present invention improves the method of transistor and electronic component lead forming by simplifying the route travelled by the component being processed and providing for a pair of movable dies which converge upon the leads.

SUMMARY OF THE INVENTION

The present invention provides a heretofore unavailable method and apparatus for conveying and indexing transistors and similar electronic components into a predetermined position, holding the components securely in the predetermined position, and, sequentially, but in a single motion, straightening the lead wires, trimming the lead wires to specified length, and forming the lead wires into shapes that will facilitate installation of the components on printed circuit boards.

The apparatus comprises a means for orienting transistors or like components and transporting the components to a forming station, holding components rigidly in position, and moving dies to effect the straightening, trimming and forming of the component wire leads. Components processed by the apparatus move linearly and directly through the single forming station and thence to a delivery bin, minimizing both cycle time and functional failure due to misdirected or mishandled components.

Accordingly, an object of the present invention is to provide a new and improved lead wire forming machine and method to position, trim, and form the leads of transistors or similar electronic components prior to installation of components on printed circuit boards.

Another object of the present invention is to provide a new and improved apparatus and method for the transportation of a transistor or similar electronic component into and through a wire lead forming station in a linear manner and in synchronization with the action of associated forming dies.

Yet another object of the present invention is to provide a new and improved method and apparatus for positioning, trimming and/or forming electrical components in which a pair of dies laminated in a novel manner move together to sequentially accomplish the desired processing in a single motion.

These and other objects and features of the present invention will become apparent from the following descriptions.

BRIEF DESCRIPTION OF THE DRAWINGS

In the Drawings

FIG. 2 is a more detailed perspective view of the internal workings of the apparatus of FIG. 1;

FIG. 2a is a detailed top view of a limited portion of the apparatus of FIG. 2;

DETAILED DESCRIPTION OF THE INVENTION

Figure 1:
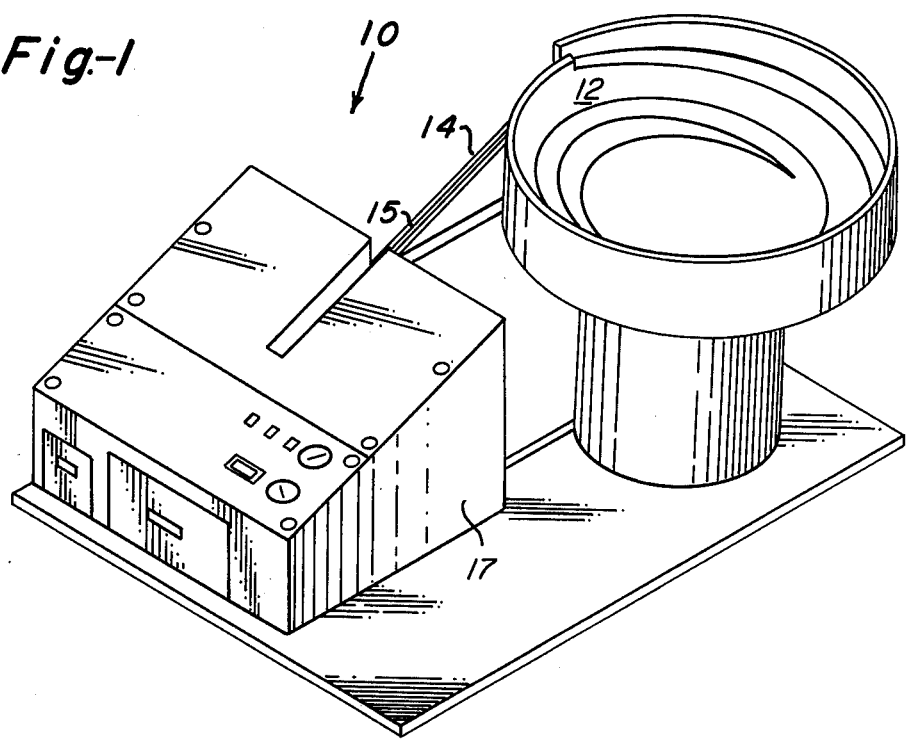
FIG. 1 is a perspective view of an apparatus in accordance with the instant invention.

Turning now to the drawings, wherein like components are designated by like numerals throughout the various figures, an apparatus for processing wire leads of transistors and similar electronic components is illustrated in FIG. 1 and generally designated by numeral 10. Apparatus 10 includes conventional vibratory bowl feed 12, track 14 and processing assembly 17. Vibratory bowl feed 12 may be any of several suitable units available, its purpose being only the orientation and introduction to track 14 of electronic components to be processed. The specific means employed to orient components for feeding into track 14 does not constitute a novel element of the instant invention. Any of the conventional orienting means appropriate for a given component may be employed.

Track 14 may be any curved or linear track having a suitable longitudinal slot 15 to allow transistors to travel to the processing assembly with their associated wire leads positioned downward.

Processing assembly 17 illustrated in FIGS. 2 and 2a includes index disc 18, positioned and journaled to rotate tangentially to track 14 such that indentations 19 spaced equally around the perimeter of disc 18 align with the curved exterior of components proceeding along track 14. Indentations 19 are thus configured to accommodate various components. Idler disc 21, pivotally mounted in opposition to index disc 18, rotates freely and exerts force through resilient ring 23 upon the components to be processed in order to ensure firm contact of components with indentations 19. Optionally, at the approximate conjunction of index disc 18 and idler disc 21, a nozzle 22 connected to a source of compressed air (not shown) is adjustably mounted to direct a stream of air to assist in the positioning of components in indentations 19 of index disc 18. Track 14 may be more steeply inclined if nozzle 22 is omitted.

A motor 24, in the preferred embodiment operating on electrical current is connected by means of shaft 25 to single tooth gear 26, which is in turn positioned so as to mesh a single tooth 27 with the indentations 19 in the perimeter of index disc 18 and thereby transmit rotational force to the disc. Gear 26 has, in addition to tooth 27, a pin 28 projecting perpendicularly to its upper face and placed so as to make contact with and bear upon pivot arm 30.

Pivot arm 30, freely rotating about pivot 31, converts the rotary motion of gear 26 to reciprocating motion and transmits this motion to locking pin 33, slidably mounted in guide 34. Spring 37 exerts constant force on locking pin 33 so that locking pin 33 alternately meshes with and is retracted from indentations 19 in disc 18 to allow rotary advancement of, and to insure precise positioning of, index disc 18. Obviously the same timing could be maintained if gear 27 incorporated additional pins 33 and teeth and rotated at a diminished rate.

Also fixed to shaft 25 and thereby caused to rotate by motor 24 in synchronization with gear 27 are cams 38 and 40. In the preferred embodiment, cam 38 is set to intermittently contact roller 41, causing arm 42 to move about pivot 43 and alternately press against and release the operating plunger of air valve 45, causing valve 45 to open and close. In essentially the same manner, but at a later time relative to the rotation of shaft 25, cam 40 makes intermittent contact with roller 47, causing arm 49 to pivot about point 50 and alternately open and close air valve 51. It will be recognized that the particular linkage illustrated and described herein is only one of many suitable for actuating control valves in position relative to the rotation of shaft 25 and thereby in synchronization with gear 27 and index disc 18.

Air valve 45 is connected, by suitable tubing or hose 52, to air cylinder 53 which is constructed so as to hold actuating rod 54 in a retracted position in the absence of operating air. Compressed air, fed from an external source (not shown) through valve 45 to cylinder 53 causes rod 54 to extend from the cylinder. Rod 54 attaches to male die 55, slidably mounted below index disc 18 and idler disc 21, such that application of compressed air through valve 45 to cylinder 53 causes die 55 to move toward and engage the wire leads of a component held at the forming station by index disc 18 and idler disc 21.

In a like manner, air valve 51 controls the application of compressed air through hose 57 to air cylinder 58 and thereby regulates the extension of actuating rod 59 which connects to female die 60. Because cylinders 53 and 58 are in direct opposition, compressed air applied to both, causes dies 55 and 60 to meet directly below the component being held in position by index disc 18 and to perform the required forming and trimming operations on the component wire leads.

Means for actuating forming dies 55 and 60, described in the preferred embodiment as employing the application of air pressure to cylinders 53 and 58, could also be in the form of electrical solenoids, hydraulic piston mechanisms, or other controllable linear force generators.

Figure 3:
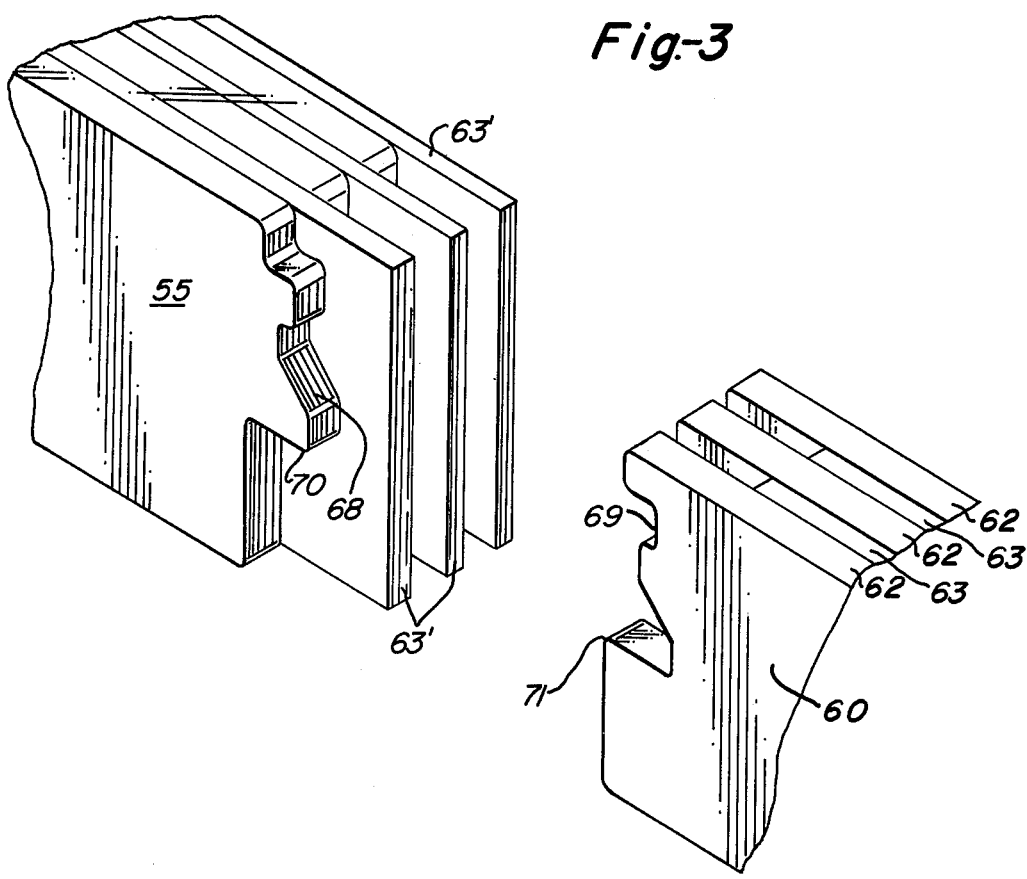
FIG. 3 is a perspective view of dies as utilized in FIG. 2.
Figure 4:
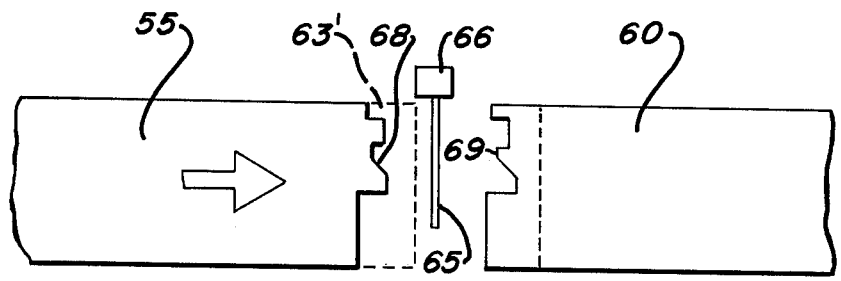
FIG. 4 is a partial view of the arrangement of the dies of the apparatus of FIG. 2.
Figure 5:
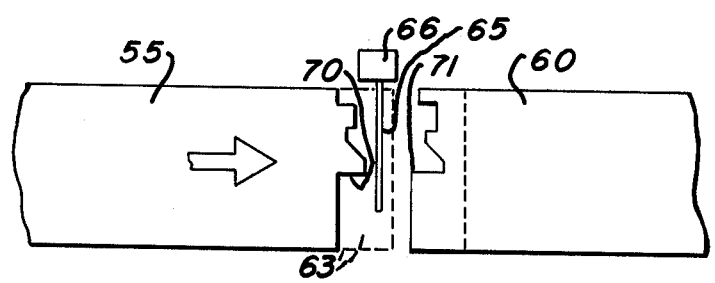
FIG. 5 is a figure similar to FIG. 4 illustrating initial movement of the dies in accordance with the instant invention.

As illustrated in FIG. 3, female die 60 is constructed as shown, of vertical laminations 62 of a suitably hard metal, with spacers 63 interspersed between laminations to form openings to receive extended spacers forming combs 63' of male die 55 as shown in FIGS. 4 through 8. Combs 63' of die 55 insure that transistor leads are straightened and held in position prior to the application of force for forming and trimming to length.

The operating cycle of apparatus 10 begins with the introduction of components directly from bulk packaging and not oriented into vibratory bowl feed 12. Bowl feed 12 orientates the components and feeds the components through track 14 to the conjunction of index disc 18 and idler disc 21. Gear 27, rotated by motor 24 through shaft 25, retracts locking pin 34 by means of pivot arm 30 and thereby releases index disc 18. Gear 27 then engages indentations 19 in index disc 18, causing the disc to rotate. As disc 18 rotates, a single component is urged into the indentation 19 approaching the conjunction of index disc 18 and idler disc 12 and held in place by idler disc 21 at the forming station. Gear 27, in continuing its rotation, disengages from index disc 18 and, through pivot arm 30, allows locking pin 34 to be extended by spring 37 to mesh with and lock index disc 18, and the component to be processed, such as transistor 66, into position, as in FIG. 4. Broken lines in the figures represent comb 63' of die 55.

Continued rotation of shaft 25 causes attached cam 38 to actuate air valve 45 through roller 41 and pivot arm 42. Pressurized air from an external source is thus introduced to cylinder 53, moving die 55 to the position illustrated in FIG. 5. Wire leads 65 of transistor 66 are straightened by combs 63' of die 55 in preparation for forming.

Figure 6:
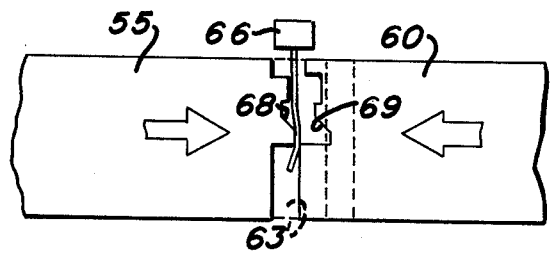
FIG. 6 is a view similar to FIG. 5 showing further movement of the dies in accordance with the instant invention.

Rotation of shaft 25 then causes cam 40 to actuate air valve 51, channeling pressurized air from an external source to cylinder 58 and moving die 60 toward the forming position, as shown in FIG. 6.

Figure 7:
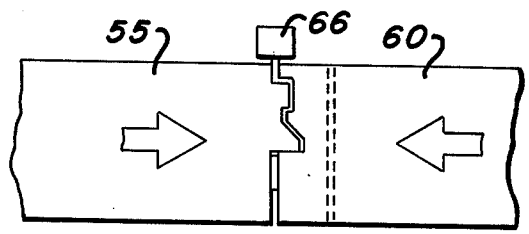
FIG. 7 is a view similar to FIG. 6 showing completion of die convergence in accordance with the instant invention.
Figure 8:
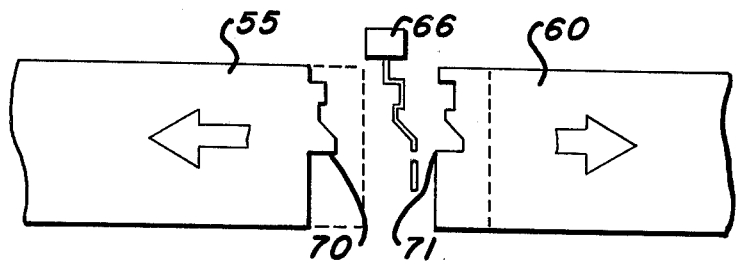
FIG. 8 is a view similar to FIG. 4 illustrating completion of the forming and trimming of the component and return of the dies to the configuration of FIG. 4.

As dies 55 and 60 meet and mesh, as shown in FIGS. 6 and 7, leads 65 of transistor 66 are formed into a shape determined by the design of the die faces 68 and 69 and subsequently trimmed to length, as in FIG. 7, by severing surfaces 70 and 71. Cams 38 and 40 are then rotated out of contact with valves 45 and 51 by shaft 25, allowing dies 55 and 60 to retract to rest position. Locking pin 34 is then retracted by pivot arm 31, gear 27 engages index disc 18, and the cycle repeats, with the lead-formed transistor 66 ejected from the apparatus 10 and another drawn into position.

Summarily, the instant invention provides apparatus and method for a simple, straight forward feed system wherein an electrical component, such as a transistor is accurately and securely positioned at a single station. Promptly, upon positioning, converging dies having comb sections are sequentially activated to move toward the component with the comb section fitting between the component leads to properly straighten and position the components for further forming. Then, as a continuation of the convergence of the dies, the leads are bent to an appropriate configuration and trimmed to the desired length. Positioning of the component is a positive step whereby each component is secured between an indexing disc and an idler disc and positioned for engagement by the dies.

Although only limited preferred embodiments of the invention have been illustrated or described, it is anticipated that various changes and modifications will be apparent to those skilled in the art and that such changes may be made without departing from the scope of the invention as defined by the following claims.

What is claimed is:

1. Apparatus for forming and trimming the leads of electronic components, the apparatus comprising:
    an index disc mounted for rotation around an axis and having defined in the periphery thereof indentations adapted to accomodate electronic components;
    a motor;
    indexing means connecting the motor to the index disc and adapted to rotate the index disc in an intermittent manner;
    an idler disc positioned adjacent the index disc to form an interface therewith and mounted for rotation around an axis substantially parallel to the axis of the index disc;
    means to lock the index disc against rotation when the index disc is not engaged for rotation by the indexing means;
    first and second timing means operably connected to the motor;
    first and second drive means each connected for activation by the first and second timing means, respectively;
    first and second die means carried one each by the first and second drive means, the first and second die means being positioned adjacent to but axially spaced from the index disc and idler disc and adapted to converge adjacent the interface between the index disc and idler disc;
    feed means adapted to supply electronic components to the interface between the index disc and idler disc;
    whereby electronic components may be supplied to the index disc and accomodated in an indentation therein, intermittently advanced by the motor driving through the indexing means to the interface position between the index disc and idler disc whereupon the first and second timing means activates the first and second drive means to converge the first and second dies adjacent the index disc and idler disc interface to trim and form leads projecting from the electronic component into the path of the converging dies.

2. Apparatus as set forth in claim 1 in which the indexing means comprise a single tooth gear and a shaft connected thereto and to the motor, the single tooth gear being positioned adjacent the index disc whereby the single tooth may engage an indentation in the index disc once every revolution of the shaft to sequentially move the index disc one increment.

3. Apparatus as set forth in claim 2 in which the means to lock the index disc comprise a dog spring loaded to engage an indentation in the index disc, the dog being movably mounted and bearing upon a pivotally mounted lever arm which lever arm also engages an eccentric pin carried on the single tooth gear to displace the dog from the indentation as the single tooth gear engages an indentation in the index wheel.

4. Apparatus as set forth in claim 2 in which the timing means comprise cam members carried on the shaft, switch means, and cam followers pivotally mounted adjacent the shaft for engagement by the cam members to activate the switch means upon rotation of the shaft.

5. Apparatus as set forth in claim 1 in which the first timing means is positioned to activate the first drive means prior to activation of the second drive means by the second timing means.

6. Apparatus as set forth in claim 1 in which the first and second die means comprise opposed, complementary male and female surfaces adapted to engage and form the lead of an electronic component, the forming surfaces of the male die member being separated by spacers projecting toward the female die from the forming surfaces and the female die member forming surfaces being separated by spacers receding from the female forming surfaces and adapted to accomodate the projecting spacers of the male die member, whereby the projecting spacers of the male die member serve to divide, straighten, and position the leads of electronic components, and thereafter accomodated in the recesses in the female die member as the male and female forming surfaces bear upon the leads.

7. Apparatus as set forth in claim 1 in which the first and second drive means comprise pneumatic cylinders activated by the first and second timing means, respectively.

8. Apparatus as set forth in claim 1 in which the feed means comprise an elongated track member having a slot defined longitudinally therethrough, the track member being positioned below the interface of the index disc and idler disc with the slot substantially tangent to both discs.

9. Apparatus for forming and trimming the leads for electronic components, the apparatus comprising;
    an index disc rotatably mounted and having defined in the periphery thereof equally spaced indentations adapted to accomodate electronic components;
    a shaft rotatably mounted and positioned substantially parallel to the axis of rotation of the index disc;
    a motor connected to the shaft;
    a single tooth gear carried co-axially with the shaft at one end thereof and positioned adjacent the index disc to engage the single tooth sequentially in adjacent indentation;
    an idler disc positioned adjacent the index disc to form an interface therewith and mounted for rotation around an axis substantially parallel to the axis of the index disc;

a locking member slidably mounted for movement adjacent the index disc and in a position perpendicular to the axis to the index disc;

a spring urging the locking member towards the index disc;

a lever arm pivotally mounted adjacent the single tooth gear and bearing against the locking member;

a pin positioned eccentrically on the single tooth gear and adapted to bear against the lever to urge the locking member away from the index disc upon engagement of the single tooth of the gear with an indentation in the index disc;

first and second cam means positioned on and axially spaced along the shaft;

first and second cam followers pivotally mounted adjacent the first and second cams, respectively;

first and second valve means positioned adjacent the first and second cam follower, respectively, and each adapted to activate upon displacement of the corresponding cam follower by the corresponding cam;

first and second pneumatic cylinders, activatable by the first and second valve means, respectively;

first and second die means each operable, connected with the first and second pneumatic cylinders, the first and second die means being positioned one each on opposite sides of the interface between the index disc and idler disc, and located immediately therebelow for convergence adjacent the interface;

and an elongated track having a slot defined therethrough positioned with the slot substantially tangential to the idler and index disc and between the interface of the index disc and idler disc and the convergence of the first and second die members.

10. Apparatus as set forth in claim 9 in which the first and second die means comprise opposed, complementary male and female surfaces adapted to engage and form the lead of an electronic component, the forming surfaces of the male die member being separated by spacers projecting toward the female die from the forming surfaces and the female die member forming surfaces being separated by spacers receding from the female forming surfaces and adapted to accomodate the projecting spacers of the male die member, whereby the projecting spacers of the male die member serve to divide, straighten, and position the leads of electronic components, and thereafter accomodated in the recesses in the female die member as the male and female forming surfaces bear upon the leads.

11. A method for forming and trimming the leads of electronic components comprising;

feeding a plurality of electronic components having leads projecting from a common side thereof serially along a slot defined in an elongated track with the leads projecting through the slot;

intermittently rotating an index disc having indentations spaced around the periphery thereof a rotational increment equal to the circumferential distance of a single indentation;

securing an electrical component positioned in an indentation between the index disc and a cooperating idler disc adjacent the index disc upon incremental rotation of the index disc;

converging complementary dies upon the leads from opposite sides thereof in a direction substantially perpendicular to the direction of the track slot;

severing excess lengths of the leads upon convergence of the dies; and forming the component leads between complementary forming surfaces defined on the converging dies;

whereupon with a single positioning of the electronic component and a continuous convergence of the dies, the component leads are formed as desired and trimmed to a desired length.

12. A method as set forth in claim 11 in which the forming surfaces on one die are spaced by a plurality of combs extending from the forming surfaces of the die and in which, upon convergence of the die, the extending combs first are moved between the leads of the component to straighten and locate the leads; and upon further convergence of the dies, the projecting combs are moved into recesses defined in the corresponding die.

13. A method as set forth in claim 12 in which the die having the combs projecting therefrom is moved towards convergence with the other die prior to initial movement of the other die.

14. A method set forth in claim 11 in which, upon completion of forming and severing of the lead components, the dies are retracted; and the index disc is moved another increment of rotation to free the formed and trimmed component and move another component into the adjacent indentation then forming the interface with the idler disc.

15. A method as set forth in claim 11 in which the index disc is secured to prevent rotation while the dies converge.

* * * * *

UNITED STATES PATENT OFFICE
CERTIFICATE OF CORRECTION

PATENT NO. : 4,108,217
DATED : August 22, 1978
INVENTOR(S) : John Kellogg Westberg, II et. al.

It is certified that error appears in the above-identified patent and that said Letters Patent are hereby corrected as shown below:

Column 3, lines 61 and 62, "position relative" should be "positive relation".

Signed and Sealed this

Twentieth Day of February 1979

[SEAL]

Attest:

RUTH C. MASON
Attesting Officer

DONALD W. BANNER
Commissioner of Patents and Trademarks